United States Patent

Setz

(10) Patent No.: US 9,224,985 B2
(45) Date of Patent: Dec. 29, 2015

(54) OPTOELECTRONIC COMPONENT

(71) Applicant: OSRAM Opto Semiconductors GmbH, Regensburg (DE)

(72) Inventor: Daniel Steffen Setz, Munich (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 14/382,779

(22) PCT Filed: Mar. 1, 2013

(86) PCT No.: PCT/EP2013/054196
§ 371 (c)(1),
(2) Date: Sep. 4, 2014

(87) PCT Pub. No.: WO2013/131826
PCT Pub. Date: Sep. 12, 2013

(65) Prior Publication Data
US 2015/0171375 A1 Jun. 18, 2015

(30) Foreign Application Priority Data
Mar. 8, 2012 (DE) .......................... 10 2012 203 672

(51) Int. Cl.
*H01L 33/00* (2010.01)
*H01L 51/52* (2006.01)
*G02B 3/00* (2006.01)

(52) U.S. Cl.
CPC ........ *H01L 51/5275* (2013.01); *H01L 51/5218* (2013.01); *H01L 51/5234* (2013.01); *H01L 51/5237* (2013.01); *G02B 3/0006* (2013.01); *H01L 2251/301* (2013.01); *Y02E 10/52* (2013.01)

(58) Field of Classification Search
None
See application file for complete search history.

(56) References Cited

U.S. PATENT DOCUMENTS

| 2007/0257608 A1 | 11/2007 | Tyan et al. |
| 2011/0108805 A1 | 5/2011 | Okai |
| 2012/0250151 A1 | 10/2012 | Lee et al. |

FOREIGN PATENT DOCUMENTS

| FR | 2938375 A1 | 5/2010 |
| JP | 200683008 A | 3/2006 |
| JP | 2010187062 A | 8/2010 |
| WO | 2011112589 A1 | 9/2011 |
| WO | 2011160031 A2 | 12/2011 |
| WO | 2012061514 A1 | 5/2012 |

OTHER PUBLICATIONS

Search Report of the German Patent and Trademark Office dated Nov. 7, 2012.
International Search Report including Written Opinion for PCT/EP2013/054196 dated Jun. 4, 2013.
(Continued)

*Primary Examiner* — Yasser A Abdelaziez
(74) *Attorney, Agent, or Firm* — Viering, Jentschura & Partner; Karl Kolbinger

(57) ABSTRACT

An optoelectronic component may include an electrically active region and a light-refracting structure which includes at least one graphene layer, in which at least one lens-like structure is formed. The electrically active region may include a first electrode, a second electrode, and an organic functional layer structure between the first electrode and the second electrode.

18 Claims, 4 Drawing Sheets

(56) References Cited

OTHER PUBLICATIONS

Chen et al., "Graphene as an anti-permeation and protective layer for indium-free transparent electrodes"; Nanotechnology, IOP, Bristol, GB, vol. 23, No. 39, Sep. 12, 2012; 395603 (6pp).

Yiri Sun and Stephen R. Forrest, Enhanced light out-coupling of organic light-emitting devices using embedded low-index grids; Nature Photonics, vol. 2; Aug. 2008; p. 483 ff.

Ziebarth et al., Extracting Light from Polymer Light-Emitting Diodes Using Stamped Bragg Gratings; Adv. Funct. Mat. 14, No. 5; 2004; p. 451 ff.

Do et al., Enhanced Light Extraction from Organic Light-Emitting Diodes with 2D SiO2/SiNx Photonic Crystals; Adv. Mater.15, No. 14; 2003; p. 1214ff.

T. Georgiou et al., "Graphene bubbles with controllable curvature"; Applied Physics Letters 99, 093103 (2011); pp. 1-4.

Azevedo et al., "Highly Ordered Monolayer, Multilayer, and Hybrid Films of Graphene Oxide Obtained by the Bubble Deposition Method"; Journal of Physical Chemistry C, vol. 115, No. 30, Aug. 4, 2011; pp. 14678-14681.

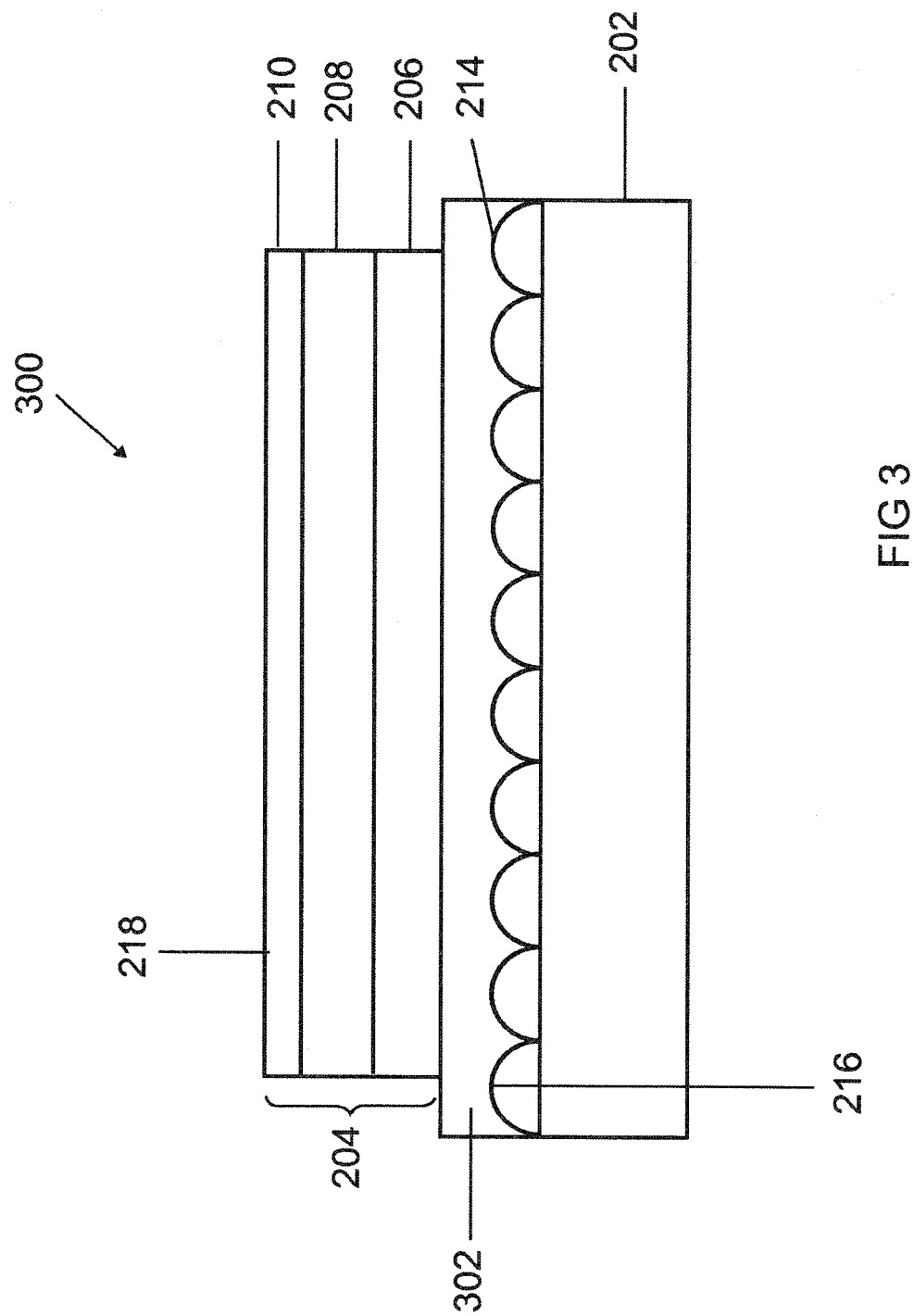

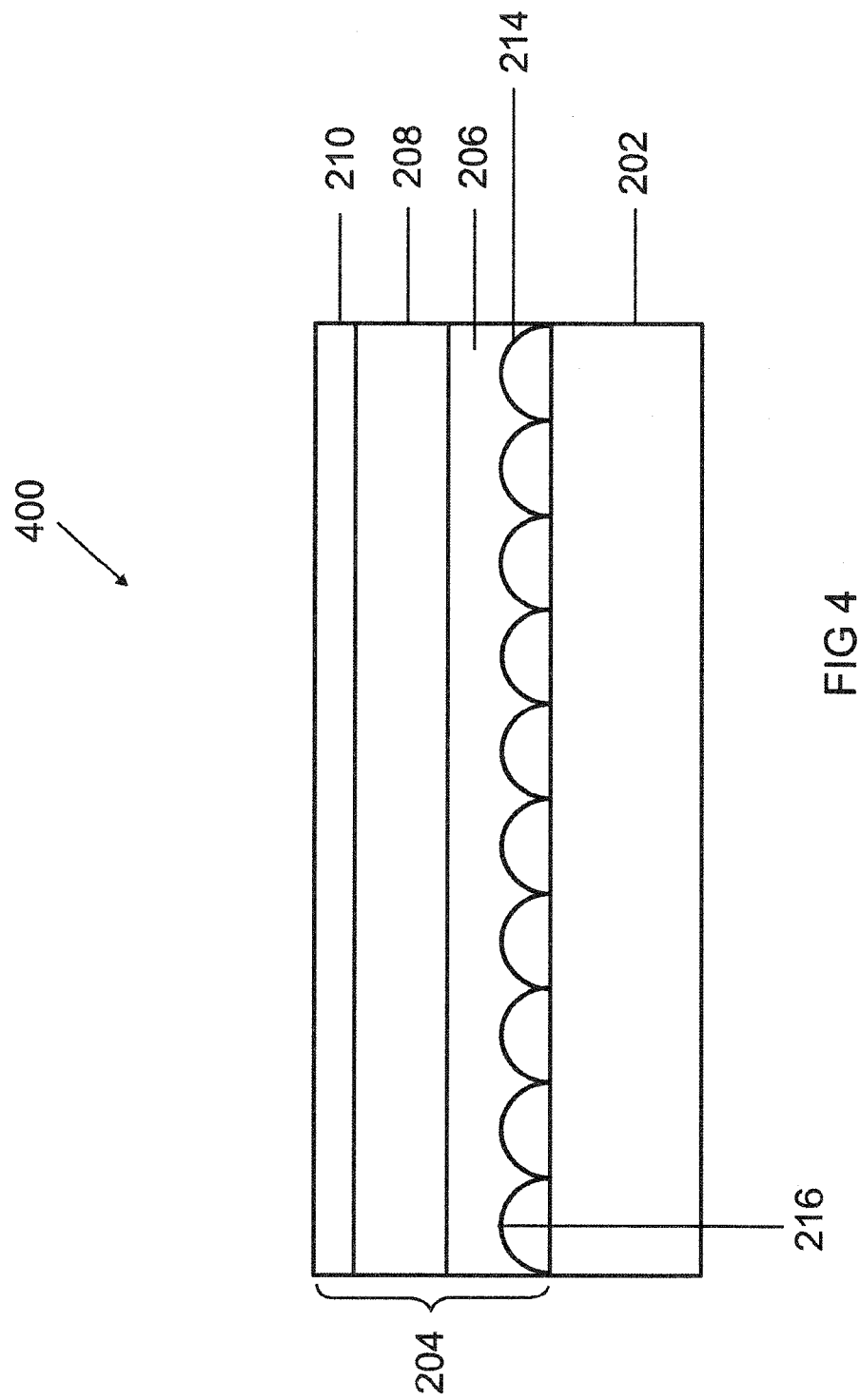

OPTOELECTRONIC COMPONENT

RELATED APPLICATIONS

The present application is a national stage entry according to 35 U.S.C. §371 of PCT application No.: PCT/EP2013/054196 filed on Mar. 1, 2013, which claims priority from German application No.: 10 2012 203 672.5 filed on Mar. 8, 2012, and is incorporated herein by reference in its entirety.

TECHNICAL FIELD

Various embodiments relate to an optoelectronic component.

BACKGROUND

In organic light emitting diodes (OLEDs), the light generated is only partially output directly.

The rest of the light is distributed in different loss channels, as represented in a representation of an organic light-emitting diode 100 in FIG. 1. FIG. 1 shows an organic light-emitting diode 100 having a glass substrate 102 and, arranged thereon, a transparent first electrode layer 104, for example consisting of indium tin oxide (ITO). Arranged on the first electrode layer 104, there is a first organic layer 106, on which an emitter layer 108 is arranged. A second organic layer 110 is arranged on the emitter layer 108. Furthermore, a second electrode layer 112, for example consisting of a metal, is arranged on the second organic layer 110. An electrical current supply 114 is coupled to the first electrode layer 104 and to the second electrode layer 112, so that an electrical current for generating light is passed through the layer structure arranged between the electrode layers 104, 112. A first arrow 116 symbolizes a transfer of electrical energy into surface plasmons, for the case in which at least one electrode 112, 104 consists of metal. A further loss channel may be seen in absorption losses in the light emission path (symbolized by means of a second arrow 118). Light not output in the desired way from the organic light-emitting diode 100 is, for example, a part of the light which results from reflection of a part of the generated light at the interface of the glass substrate 102 with air (symbolized by means of a third arrow 122) and from reflection of a part of the generated light at the interface between the first electrode layer 104 and the glass substrate 102 (symbolized by means of a fourth arrow 124). The part of the generated light output from the glass substrate 102 is symbolized in FIG. 1 by means of a fifth arrow 120. As can be seen, there are therefore the following loss channels, for example: light loss in the glass substrate 102, light loss in the organic layers and the transparent electrode 104, 106, 108 and 110 and surface plasmons generated on the metal cathode (second electrode layer 112). These light components cannot readily be output from the organic light-emitting diode 100.

To date, there have been two approaches for increasing the light output:
(1) external output; and
(2) internal output.

External output may be understood as meaning that a device is adapted so that it outputs the light from the substrate in emitted light.

Examples of such a device may be:
(a) sheets with scattering particles on the outer side of the substrate;
(b) sheets with surface structures (for example microlenses);
(c) direct structuring of the outer side of the substrate; and
(d) introduction of scattering particles into the glass.

Some of these approaches (for example scattering sheets) are already used in OLED lighting modules, or their capacity for scaling up has been shown.

Inter alia, these approaches for external light output have the following two disadvantages:
(1) the output efficiency is limited to approximately 60 to 70% of the light guided in the substrate.
(2) The appearance of the OLED is substantially influenced. Applied layers or films lead to a milky/diffusely reflective surface.

Internal output can be understood as meaning that a device is adapted so that it outputs the light which is guided in the organics and the transparent electrode. There are several known technological approaches for this, but they are not yet available on the market in OLED products.

Such approaches are, for example:
(1) so-called low-index grids (as described, for example, in Sun and Forrest, Nature Photonics, page 483 ff., 2008; these consist of structured regions including a material with low refractive index, which are applied on the ITO electrode).
(2) highly refractive scatters below an ITO anode in a polymer matrix (as described, for example, in US 2007/0257608 A1). In this case, the polymer matrix generally has a refractive index in a range of n=1.5 (for example at a wavelength of 633 nm) and is usually applied wet-chemically.
(3) So-called Bragg gratings or photonic crystals with periodic diffraction structures having structure sizes in the wavelength range of light (as described, for example, in Ziebarth et al., Adv. Funct. Mat. 14, page 451 ff., 2004; and Do et al., Adv. Mat. 15, page 1214 ff., 2003).

Furthermore, T. Georgiou et al., Graphene bubbles with controllable curvature, Applied Physical Letters, Vol. 99, 2011 describes a method for producing graphene bubbles.

SUMMARY

In various embodiments, as can be seen, an optoelectronic component is provided, which owing to the use of graphene-based light-refracting structures permits improved light output or light input.

In various embodiments, an optoelectronic component is provided, including an electrically active region which includes a first electrode; a second electrode; and an organic functional layer structure between the first electrode and the second electrode. The optoelectronic component may furthermore include a light-refracting structure which includes at least one graphene layer, in which at least one lens-like structure is formed.

By virtue of the lens-like structure in the at least one graphene layer, the light input (for example in the case of a solar cell as the optoelectronic component) or the light output (for example in the case of a light-emitting component, for example a light-emitting diode, for example an organic light-emitting diode (OLED)) can be improved significantly, without having to make the production process of the optoelectronic component significantly more complex. A graphene layer can also be integrated very economically and simply into the production process.

In one configuration, the graphene layer may include a plurality of lens-like structures.

In another configuration, the graphene layer may form a part of the first electrode and/or of the second electrode.

In another configuration, the optoelectronic component may furthermore include a carrier; the graphene layer may be arranged as part of the first electrode on or over the carrier.

In another configuration, the second electrode may be configured so as to be translucent or reflective.

In another configuration, the graphene layer may be arranged outside the electrically active region.

In another configuration, the optoelectronic component may furthermore include a carrier, the graphene layer being arranged on or over the carrier. Furthermore, the optoelectronic component may include a planarization layer on the graphene layer, in which case the electrically active region may be arranged on or over the planarization layer.

In another configuration, the optoelectronic component may furthermore include an encapsulation, which may be arranged between the electrically active region and the carrier.

In another configuration, the encapsulation may be arranged between the electrically active region and the graphene layer or between the electrically active region and the planarization layer.

In another configuration, the planarization layer may have a refractive index which may be substantially equal to the refractive index of the organic functional layer structure.

In another configuration, the first electrode may be arranged on or over the planarization layer, in which case the first electrode may be configured so as to be translucent, and wherein the second electrode may be configured so as to be translucent or reflective.

In another configuration, the first electrode may be configured so as to be reflective, and the second electrode may be configured so as to be translucent, in which case the graphene layer may be arranged on or over the second electrode.

In another configuration, the optoelectronic component may furthermore include a carrier, in which case the first electrode may be arranged on or over the carrier.

In another configuration, the optoelectronic component may furthermore include an encapsulation on or over the second electrode.

In another configuration, the graphene layer may be arranged on or over the encapsulation.

In another configuration, the optoelectronic component may furthermore include a cover layer on or over the graphene layer.

In another configuration, the at least one lens-like structure may be at least partially filled with a liquid and/or a solid.

In another configuration, the liquid and/or the solid may have a refractive index which is substantially equal to the refractive index of the organic functional layer structure.

In another configuration, the cover layer may have a refractive index which is less than the refractive index of the liquid and/or of the solid.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIG. 3 shows a cross-sectional view of a light-emitting component according to various embodiments; and FIG. 4 shows a cross-sectional view of a light-emitting component according to various embodiments.

DETAILED DESCRIPTION

Figure 1:
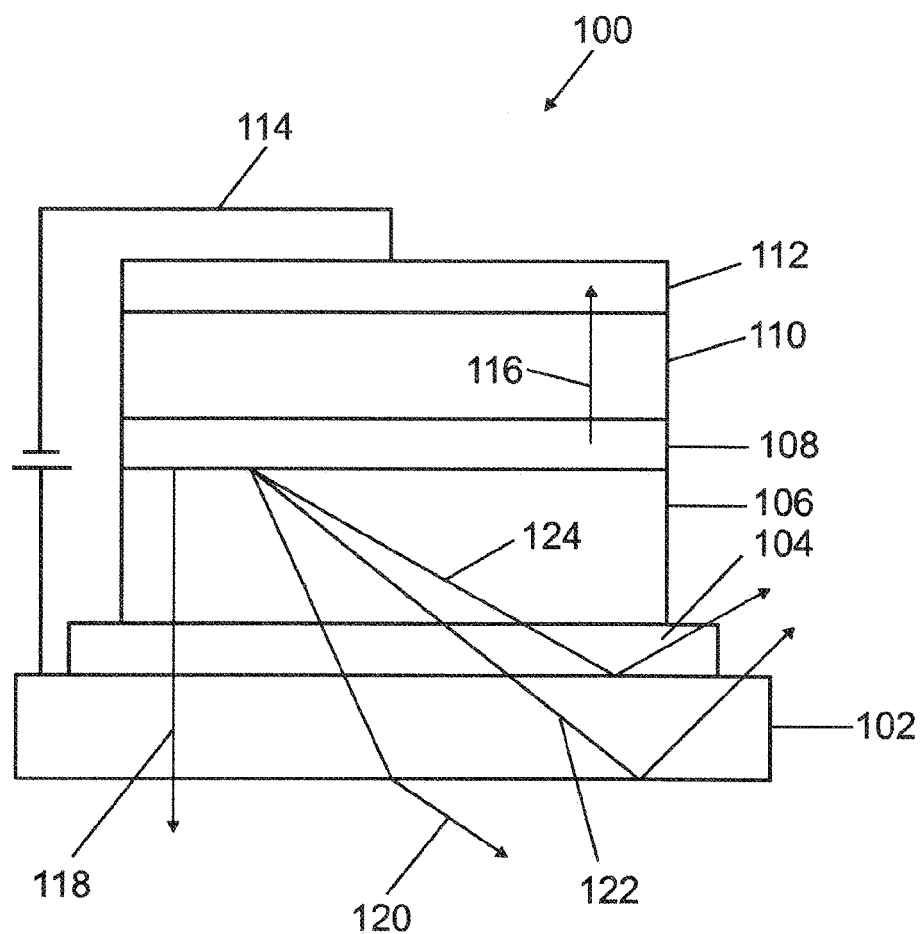
FIG. 1 shows a cross-sectional view of a conventional light-emitting component.

The following detailed description refers to the accompanying drawing that show, by way of illustration, specific details and embodiments in which the disclosure may be practiced.

In the following detailed description, reference is made to the appended drawings, which form part of this and in which specific embodiments, in which the invention can be implemented, are shown for illustration. In this regard, direction terminology such as "up", "down", "forward", "backward", "front", "rear", etc. is used with reference to the orientation of the figure or figures being described. Since components of embodiments can be positioned in a number of different orientations, the direction terminology is used for illustration and is in no way restrictive. It is to be understood that other embodiments may be used and structural or logical modifications may be carried out, without departing from the protective scope of the present invention. It is to be understood that the features of the various embodiments described herein may be combined with one another, unless specifically indicated otherwise. The following detailed description is therefore not to be interpreted in a restrictive sense, and the protective scope of the present invention is defined by the appended claims.

In the scope of this description, terms such as "connected" and "coupled" are used to describe both direct and indirect connection, and direct or indirect coupling. In the figures, elements which are identical or similar are provided with identical references, insofar as this is expedient.

Even though, in the following embodiments, various embodiments are described with reference to various specific embodiments in which the optoelectronic component is produced in the form of an organic light-emitting diode (OLED), it should be pointed out that alternative embodiments may be provided for other optoelectronic components, for example for a solar cell or for other light-emitting components, for example a light-emitting diode (LED), or for example for a photodiode or a phototransistor, which may for example be configured as a light sensor.

The optoelectronic component, for example the light-emitting component, may in various embodiments be part of an integrated circuit. Furthermore, a multiplicity of light-emitting components may be provided, for example fitted in a common housing.

As can be seen, according to various embodiments, in order to increase the light output or light input, one or more graphene layers are provided in the structure of the optoelectronic component, before having a lens-like structure, for example in the form of one or more bubbles (graphene bubbles). Such a lens-like structure may, for example, be formed by applying a periodic arrangement or a nonperiodic arrangement of graphene bubbles (also referred to below as graphene lenses) within an optoelectronic component, for example within a light-emitting component, for example within an OLED, for example on a substrate or on an OLED, and for example the light output is thereby increased. In various embodiments, new possibilities are thus provided for the production of structured substrates for light-emitting components, or in general for optoelectronic components, for example for OLEDs.

In various embodiments, the spherical graphene bubbles may be formed with the aid of graphene monolayers, for example produced in a manner which is described in T. Georgiou et al., Graphene bubbles with controllable curvature, Applied Physical Letters, Vol. 99, 2011. The graphene bubbles are used in combination with an optoelectronic component, for example a light-emitting component, for example an OLED, in order to produce lens structures, by which the light output (or light input) can be increased, on or in the optoelectronic component (on or in the OLED). These lens structures have a size of the order of magnitude of, for example, up to 10 µm, and are therefore comparable with the sizes of commercially available microlenses. Since the graphene bubbles are self-forming, in various embodiments a very economical production process is provided. Furthermore, new possibilities for arranging such lenses (in general such lens-like structures) within the OLEDs are thereby provided.

Figure 2:
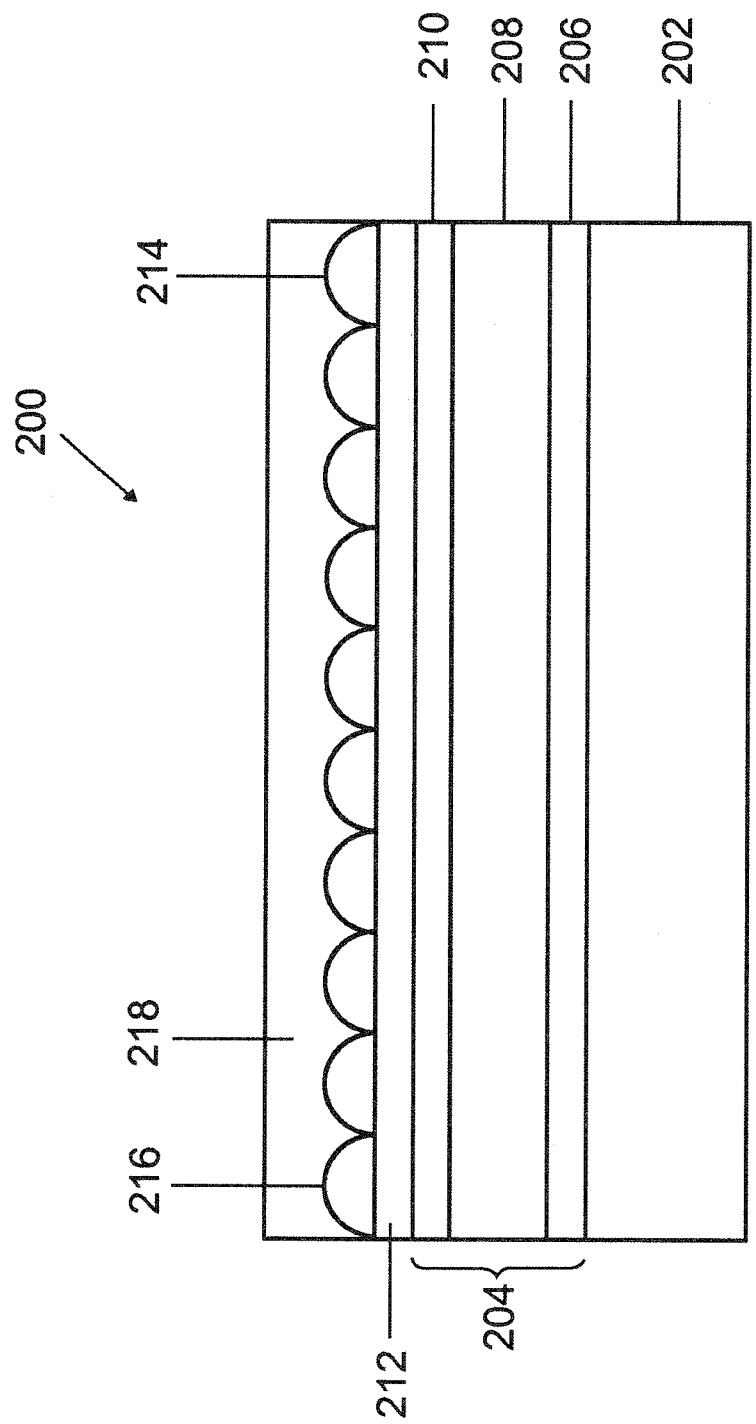
FIG. 2 shows a cross-sectional view of a light-emitting component according to various embodiments.

FIG. 2 shows a cross-sectional view of a light-emitting component 200, for example in the form of an OLED 200, according to various embodiments.

In various embodiments, the light-emitting component 200 in the form of an organic light-emitting diode 200 (OLED 200) may include a carrier, for example a substrate 202. The substrate 202 may for example be used as a carrier element for electronic elements or layers, for example light-emitting elements. For example, the substrate 202 may include or be formed from glass, quartz and/or a semiconductor material, or any other suitable material. Furthermore, the substrate 202 may include or be formed from a plastic sheet or a laminate having one or more of plastic sheets. The plastic may include or be formed from one or more polyolefins (for example polyethylene (PE) with high or low density or polypropylene (PP)). Furthermore, the plastic may include or be formed from polyvinyl chloride (PVC), polystyrene (PS), polyester and/or polycarbonate (PC), polyethylene terephthalate (PET), polyether sulfone (PES) and/or polyethylene naphthalate (PEN). The substrate 202 may include one or more of the materials mentioned above. The substrate 202 may be configured so as to be translucent or even transparent.

In various embodiments, the term "translucent" or "translucent layer" may be understood as meaning that a layer is transmissive for light, for example for the light generated by the light-emitting component, for example of one or more wavelength ranges, for example for light in a wavelength range of visible light (for example at least in a subrange of the wavelength range of from 380 nm to 780 nm). For example, in various embodiments the term "translucent layer" is to be understood as meaning that essentially the total amount of light input into a structure (for example a layer) is also output from the structure (for example layer), in which case a part of the light may be scattered.

In various embodiments, the term "transparent" or "transparent layer" may be understood as meaning that a layer is transmissive for light (for example at least in a subrange of the wavelength range of from 380 nm to 780 nm), light input into a structure (for example a layer) also being output from the structure (for example layer) essentially without scattering or light conversion. In various embodiments, "transparent" is therefore to be regarded as a special case of "translucent".

For the case in which, for example, a light-emitting electronic component which is monochromatic or limited in its emission spectrum is intended to be provided, it is sufficient for the optical translucent layer structure to be translucent at least in a subrange of the wavelength range of the desired monochromatic light, or for the limited emission spectrum.

In various embodiments, the organic light-emitting diode 200 (or the light-emitting components according to the embodiments described above or below) may be configured as a so-called top and bottom emitter. A top and bottom emitter may also be referred to as an optically transparent component, for example a transparent organic light-emitting diode.

In various embodiments, a barrier layer (not represented) may optionally be arranged on or over the substrate 202. The barrier layer may include or consist of one or more of the following materials: aluminum oxide, zinc oxide, zirconium oxide, titanium oxide, hafnium oxide, tantalum oxide, lanthanum oxide, silicon oxide, silicon nitride, silicon oxynitride, and mixtures and alloys thereof. Furthermore, in various embodiments the optional barrier layer may have a layer thickness in a range of from approximately 0.1 nm (one atomic layer) to approximately 5000 nm, for example a layer thickness in a range of from approximately 10 nm to approximately 200 nm, for example a layer thickness of approximately 40 nm.

An electrically active region 204 of the light-emitting component 200 may be arranged on or over the barrier layer (or on or over the carrier 202). The electrically active region 204 may be understood as meaning the region of the light-emitting component 200 in which an electrical current for operation of the light-emitting component 200 flows. In various embodiments, the electrically active region 204 may include a first electrode 206, a second electrode 210 and an organic functional layer structure 208, as will be explained in more detail below.

Thus, in various embodiments, the first electrode 206, (for example in the form of a first electrode layer 206) may be applied on or over the barrier layer (or, if there is no barrier layer, on or over the substrate 202). The first electrode 206 (also referred to below as the lower electrode 206) may be formed from, or may be, an electrically conductive material, for example from a metal or a transparent conductive oxide (TCO) or a layer stack of a plurality of layers of the same metal or different metals, and/or of the same TCO or different TCOs. Transparent conductive oxides are transparent conductive materials, for example metal oxides, for example zinc oxide, tin oxide, cadmium oxide, titanium oxide, indium oxide or indium tin oxide (ITO). Besides binary metal-oxygen compounds, for example ZnO, $SnO_2$, or $In_2O_3$, ternary metal-oxygen compounds, for example AlZnO, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides, also belong to the TCO group and may be used in various embodiments. Furthermore, the TCOs do not necessarily correspond to a stoichiometric composition, and may furthermore be p-doped or n-doped.

In various embodiments, the first electrode 206 may include a metal; for example Ag, Pt, Au, Mg, Al, Ba, In, Ag, Au, Mg, Ca, Sm or Li, as well as compounds, combinations or alloys of these materials.

In various embodiments, the first electrode 206 may be formed from a layer stack of a combination of a layer of a metal on a layer of a TCO, or vice versa. One example is a silver layer, which is applied on an indium tin oxide layer (ITO) (Ag on ITO) or ITO/Ag/ITO multilayers.

In various embodiments, the first electrode 206 may provide one or more of the following materials as an alternative or in addition to the materials mentioned above: networks of metal nanowires and nanoparticles, for example of Ag; networks of carbon nanotubes; graphene particles and graphene layers; networks of semiconducting nanowires.

Furthermore, the first electrode 206 may include electrically conductive polymers or transition metal oxides or electrically conductive transparent oxides.

In various embodiments, the first electrode 206 and the substrate 202 may be formed so as to be translucent or transparent. In the case in which the first electrode 206 is formed from a metal, the first electrode 206 may for example have a layer thickness less than or equal to approximately 25 nm, for example a layer thickness less than or equal to approximately 20 nm, for example a layer thickness less than or equal to approximately 18 nm. Furthermore, the first electrode 206 may for example have a layer thickness greater than or equal to approximately 10 nm, for example a layer thickness greater than or equal to approximately 15 nm. In various embodiments, the first electrode 206 may have a layer thickness in a range of from approximately 10 nm to approximately 25 nm, for example a layer thickness in a range of from approximately 10 nm to approximately 18 nm, for example a layer thickness in a range of from approximately 15 nm to approximately 18 nm.

Furthermore, for the case in which the first electrode 206 is formed from a conductive transparent oxide (TCO), the first electrode 206 may for example have a layer thickness in a range of from approximately 50 nm to approximately 500 nm, for example a layer thickness in a range of from approximately 75 nm to approximately 250 nm, for example a layer thickness in a range of from approximately 100 nm to approximately 150 nm.

Furthermore, for the case in which the first electrode 206 is formed for example from a network of metal nanowires, for example of Ag, which may be combined with conductive polymers, a network of carbon nanotubes, which may be combined with conductive polymers, or of graphene layers and composites, the first electrode 206 may for example have a layer thickness in a range of from approximately 1 nm to approximately 500 nm, for example a layer thickness in a range of from approximately 10 nm to approximately 400 nm, for example a layer thickness in a range of from approximately 40 nm to approximately 250 nm.

The first electrode 206 may be formed as an anode, i.e. as a hole-injecting electrode, or as a cathode, i.e. as an electron-injecting electrode.

The first electrode 206 may include a first electrical terminal, to which a first electrical potential (provided by an energy source (not represented), for example a current source or a voltage source) can be applied. As an alternative, the first electrical potential may be applied to the substrate 202 and then delivered indirectly via the latter to the first electrode 206. The first electrical potential may, for example, be ground potential or another predetermined reference potential.

Furthermore, the electrically active region 204 of the light-emitting component 200 may include an organic electroluminescent layer structure 208, which is applied on or over the first electrode 206.

The organic electroluminescent layer structure 208 may contain one or more emitter layers (not represented), for example including fluorescent and/or phosphorescent emitters, as well as one or more hole conduction layers (also referred to as hole transport layer or layers).

In various embodiments, as an alternative or in addition, one or more electron conduction layers (also referred to as electron transport layer or layers) may be provided.

Examples of emitter materials which may be used in the light-emitting component 200 according to various embodiments for the emitter layer or layers include organic or organometallic compounds, for example derivatives of polyfluorene, polythiophene and polyphenylene (for example 2- or 2,5-substituted poly-p-phenylene vinylene) and metal complexes, for example iridium complexes, for example blue phosphorescent FIrPic (bis(3,5-difluoro-2-(2-pyridyl)phenyl-(2-carboxypyridyl)-iridium III), green phosphorescent Ir(ppy)$_3$ (tris(2-phenylpyridine) iridium III), red phosphorescent Ru(dtb-bpy)$_3$*2(PF$_6$) (tris[4,4'-di-tert-butyl-(2,2')-bipyridine]ruthenium(III) complex) and blue fluorescent DPAVBi (4,4-bis[4-(di-p-tolylamino)styryl]biphenyl), green fluorescent TTPA (9, 10-bis[N,N-di-(p-tolyl)-amino]anthracene) and red fluorescent DCM2 (4-dicyanomethylene)-2-methyl-6-julolidyl-9-enyl-4H-pyrane) as nonpolymeric emitters. Such nonpolymeric emitters may, for example, be deposited by means of thermal evaporation. Furthermore, polymeric emitters may be used, which may in particular be deposited by means of a wet chemical method, for example a spin coating method (also referred to as spin coating).

The emitter materials may be embedded in a suitable way in a matrix material.

It should be pointed out that other suitable emitter materials are likewise provided in other embodiments.

The emitter materials of the emitter layer or layers of the light-emitting component 200 may, for example, be selected in such a way that the light-emitting component 200 emits white light. The emitter layer or layers may include a plurality of emitter materials emitting different colors (for example blue and yellow or blue, green and red); as an alternative, the emitter layer or layers may also be constructed from a plurality of sublayers, for example a blue fluorescent emitter layer or blue phosphorescent emitter layer, a green phosphorescent emitter layer and a red phosphorescent emitter layer. Mixing of the different colors can lead to the emission of light with a white color impression. As an alternative, a converter material may also be arranged in the beam path of the primary emission generated by these layers, which material at least partially absorbs the primary radiation and emits secondary radiation with a different wavelength, so that a white color impression is obtained from (not yet white) primary radiation by the combination of primary and secondary radiation.

The organic electroluminescent layer structure 208 may in general include one or more electroluminescent layers. The one or more electroluminescent layers may include organic polymers, organic oligomers, organic monomers, nonpolymeric organic small molecules, or a combination of these materials. For example, the organic electroluminescent layer structure 208 may include one or more electroluminescent layers which is or are configured as a hole transport layer, so that, for example in the case of an OLED, effective hole injection into an electroluminescent layer or an electroluminescent region is made possible. As an alternative, in various embodiments the organic electroluminescent layer structure 208 may include one or more functional layers which is or are configured as an electron transport layer, so that, for example in the case of an OLED, effective electron injection into an electroluminescent layer or an electroluminescent region is made possible. For example, tertiary amines, carbazoderivatives, conductive polyaniline or polyethylene dioxythiophene may be used as a material for the hole transport layer. In various embodiments, the one or the plurality of electroluminescent layers may be configured as an electroluminescent layer.

In various embodiments, the hole transport layer may be applied, for example deposited, on or over the first electrode 206, and the emitter layer may be applied, for example deposited, on or over the hole transport layer. In various embodiments, an electron transport layer may be applied, for example deposited, on or over the emitter layer.

In various embodiments, the organic electroluminescent layer structure 208 (i.e. for example the sum of the thicknesses of hole transport layer or layers and emitter layer or layers and electron transport layer or layers) may have a layer thickness of at most approximately 1.5 µm, for example a layer thickness of at most approximately 1.2 µm, for example a layer thickness of at most approximately 1 μm, for example a layer thickness of at most approximately 800 nm, for example a layer thickness of at most approximately 500 nm, for example a layer thickness of at most approximately 400 nm, for example a layer thickness of at most approximately 300 nm. In various embodiments, the organic electroluminescent layer structure 208 may for example include a stack of a plurality of organic light-emitting diodes (OLEDs) are arranged directly above one another, in which case each OLED may for example have a layer thickness of at most approximately 1.5 μm, for example a layer thickness of at most approximately 1.2 μm, for example a layer thickness of at most approximately 1 μm, for example a layer thickness of at most approximately 800 nm, for example a layer thickness of at most approximately 500 nm, for example a layer thickness of at most approximately 400 nm, for example a layer thickness of at most approximately 300 nm. In various embodiments, the organic electroluminescent layer structure 208 may for example include a stack of two, three or four OLEDs which are arranged directly above one another, in which case, for example, the organic electroluminescent layer structure 208 may have a layer thickness of at most approximately 3 μm.

The light-emitting component 200 may in general optionally include further organic functional layers, for example arranged on or over the one or more emitter layers or on or over the electron transport layer or layers, which are used to further improve the functionality and therefore the efficiency of the light-emitting component 200.

The second electrode 210 may be applied (for example in the form of a second electrode layer 210) on or over the organic electroluminescent layer structure 208, or optionally on or over the one or the plurality of further organic functional layers.

In various embodiments, the second electrode 210 may include or be formed from the same materials as the first electrode 206, metals being particularly suitable in various embodiments.

In various embodiments, the second electrode 210 (for example for the case of a metal second electrode 210) may for example have a layer thickness less than or equal to approximately 50 nm, for example a layer thickness less than or equal to approximately 45 nm, for example a layer thickness less than or equal to approximately 40 nm, for example a layer thickness less than or equal to approximately 35 nm, for example a layer thickness less than or equal to approximately 30 nm, for example a layer thickness less than or equal to approximately 25 nm, for example a layer thickness less than or equal to approximately 20 nm, for example a layer thickness less than or equal to approximately 15 nm, for example a layer thickness less than or equal to approximately 10 nm.

The second electrode 210 may in general be formed in a similar way as the first electrode 206, or differently thereto. The second electrode 210 may in various embodiments be formed from one or more of the materials and with the respective layer thickness described above in connection with the first electrode 206. In various embodiments, the first electrode 206 and the second electrode 210 are both formed so as to be translucent or transparent. The light-emitting component 200 represented in FIG. 2 may therefore be configured as a top and bottom emitter (expressed in another way, as a transparent light-emitting component 200).

As an alternative, the light-emitting component 200 represented in FIG. 2 may be configured as a top emitter, in which case the first electrode 206 is configured as a reflective electrode 206 and the second electrode 210 is configured as a translucent electrode 210 or as a transparent electrode 210.

The second electrode 210 may be configured as an anode, i.e. as a hole-injecting electrode, or as a cathode, i.e. as an electron-injecting electrode.

The second electrode 210 may include a second electrical terminal, to which a second electrical potential (which is different to the first electrical potential) provided by the energy source can be applied. The second electrical potential may, for example, have a value such that the difference from the first electrical potential has a value in a range of from approximately 1.5 V to approximately 20 V, for example a value in a range of from approximately 2.5 V to approximately 15 V, for example a value in a range of from approximately 3 V to approximately 12 V.

An encapsulation 212, for example in the form of a barrier thin film/thin-film encapsulation 212, may optionally also be on or over the second electrode 210, and therefore on or over the electrically active region 204.

In the scope of this application, a "barrier thin film" 212 may, for example, be understood as meaning a layer or a layer structure which is suitable for forming a barrier against chemical contaminants or atmospheric substances, in particular against water (moisture) and oxygen. In other words, the barrier thin film 212 is formed in such a way that it cannot be penetrated, or can be penetrated at most in very small amounts, by substances which damage OLEDs, such as water, oxygen or solvent.

According to one configuration, the barrier thin film 212 may be formed as an individual layer (expressed another way, as a single layer). According to an alternative configuration, the barrier thin film 212 may include a multiplicity of sublayers formed on one another. In other words, according to one configuration the barrier thin film 212 may be formed as a layer stack. The barrier thin film 212, or one or more sublayers of the barrier thin film 212, may for example be formed by means of a suitable deposition method, for example by means of an atomic layer deposition (ALD) method according to one configuration, for example a plasma-enhanced atomic layer deposition (PEALD) method or a plasmaless atomic layer deposition (PLALD) method, or by means of a chemical vapor deposition (CVD) method according to another configuration, for example a plasma-enhanced chemical vapor deposition (PECVD) method or a plasmaless chemical vapor deposition (PLCVD) method, or alternatively by means of other suitable deposition methods.

By using an atomic layer deposition (ALD) method, very thin layers can be deposited. In particular, layers whose layer thicknesses lie in the atomic layer range can be deposited.

According to one configuration, in the case of a barrier thin film 212 which includes a plurality of sublayers, all the sublayers may be formed by means of an atomic layer deposition method. A layer sequence which only includes ALD layers may also be referred to as a "nanolaminate".

According to an alternative configuration, in the case of a barrier thin film 212 which includes a plurality of sublayers, one or more sublayers of the barrier thin film 212 may be deposited by means of a deposition method other than an atomic layer deposition method, for example by means of a vapor deposition method.

The barrier thin film 212 may, according to one configuration, have a layer thickness of from approximately 0.1 nm (one atomic layer) to approximately 1000 nm, for example a layer thickness of from approximately 10 nm to approximately 100 nm according to one configuration, for example approximately 40 nm according to one configuration.

According to one configuration, in which the barrier thin film 212 includes a plurality of sublayers, all the sublayers may have the same layer thickness. According to another configuration, the individual sublayers of the barrier thin film 212 may have different layer thicknesses. In other words, at least one of the sublayers may have a different layer thickness than one or more others of the sublayers.

The barrier thin film 212, or the individual sublayers of the barrier thin film 212, may according to one configuration be formed as a translucent or transparent layer. In other words, the barrier thin film 212 (or the individual sublayers of the barrier thin film 212) may consist of a translucent or transparent material (or a material combination which is translucent or transparent).

According to one configuration, the barrier thin film 212, or (in the case of a layer stack including a multiplicity of sublayers) one or more of the sublayers of the barrier thin film 212, may include or consist of one of the following materials: aluminum oxide, zinc oxide, zirconium oxide, titanium oxide, hafnium oxide, tantalum oxide, lanthanum oxide, silicon oxide, silicon nitride, silicon oxynitride, and mixtures and alloys thereof. In various embodiments, the barrier thin film 212, or (in the case of a layer stack including a multiplicity of sublayers) one or more of the sublayers of the barrier thin film 212, may include one or more high-index materials, or expressed another way one or more materials having a high refractive index, for example having a refractive index of at least 1.8.

In various embodiments, a light-refracting structure 214 may be arranged on or over the encapsulation 212. The light-refracting structure 214 may include a graphene layer structure having one or more graphene layers, in which at least one lens-like structure is formed, or expressed another way which includes or include one or more lens-like structures.

The one or more graphene layers may be formed according to the method described in T. Georgiou et al., Graphene bubbles with controllable curvature, Applied Physical Letters, Vol. 99, 2011, and processed in such a way that the one or more graphene layers includes or include one or more lens-like structures 216. In various embodiments, the at least one graphene layer may therefore be formed from a monolayer of graphene. Furthermore, in various embodiments, a plurality of graphene layers (each formed from a monolayer of graphene) may be arranged stacked above one another, in which case a plurality of lens-like structures may optionally be formed above one another.

As described in T. Georgiou et al., Graphene bubbles with controllable curvature, Applied Physical Letters, Vol. 99, 2011, the curvature of the lenses of the lens-like structure 216 may be adapted, or formed in a desired way, with the aid of an electrical voltage. In various embodiments, the possibility is therefore provided of adapting the radius of curvature to the desired application, on the one hand, and on the other hand of introducing process reliability. For example, during the application of an optional planarization layer, an optional protective layer, and/or one or more optional high-index layers, a voltage may be applied to the graphene layer in order to make the process more reproducible. After the curing of the additional aforementioned optional layers, they are stable enough to stabilize the lens-like structure, so that the application of an electrical voltage is no longer necessary.

Therefore, as can be seen in the embodiments represented in FIG. 2, a monolayer of graphene, in which the graphene bubbles form, is applied on or over the second electrode 210, which may for example be configured so as to be translucent or transparent. Within the graphene bubbles, or expressed another way in the space between the graphene bubbles and the second electrode 210 or the encapsulation 212, air may be contained, or as an alternative or in addition a liquid and/or a solid body, the liquid and/or the solid body in various embodiments having a refractive index of at least n=1.8 (for example at a wavelength of 633 nm), i.e. expressed another way it is highly refractive so that a lens effect is achieved, as a result of which the total reflection of the interface with air is at least partially eliminated or at least reduced. When the refractive index of the liquid and/or of the solid body in the graphene bubble or bubbles is selected to be higher, for example for the case in which the liquid and/or the solid body in the graphene bubble or bubbles has a refractive index in a range of from approximately n=1.8 to approximately n=1.9 (for example at a wavelength of 633 nm), the light output (or optionally light input) of the optoelectronic component 200, for example of the OLED 200, is commensurately better.

It should be pointed out that, in alternative embodiments, the graphene bubbles need not necessarily be applied on a solid encapsulation 212 or a solid second electrode 210; rather, the bubble formation during the formation of the graphene layer may also take place on a liquid layer which, for example, may be applied beforehand onto the encapsulation 212 or the second electrode 210, in which case the liquid layer may for example contain the liquid or be formed by the liquid which is intended to be contained as a high-index material within the graphene bubbles. The graphene bubbles are formed on the surface of the encapsulation 212, or of the second electrode 210, in such a way that the liquid within the graphene bubbles is enclosed between the graphene and the encapsulation 212, or the second electrode 210.

Furthermore, according to other alternative embodiments, the graphene layer may initially be formed independently of the optoelectronic component 200, including the graphene bubbles, the liquid (which subsequently forms the high-index material) then being introduced into the graphene bubble "troughs" formed, and the component subsequently being placed with the exposed surface of the encapsulation 212 or of the second electrode 210 on the (as can be seen open upward) lens-like structure 216, so that the liquid is enclosed, heating then being carried out so that firm bonding takes place between the graphene layer and the surface of the encapsulation 212, or of the second electrode 210.

Subsequently, a protective layer 218 may be applied, for example deposited, onto the structure now formed, on or over the graphene layer. The protective layer 218 may include an adhesive and/or a protective coating, by means of which, for example, a cover (not represented) (for example a glass cover) is fastened, for example adhesively bonded, on the lens-like structure. In various embodiments, the optically translucent layer of adhesive and/or protective coating (for example in general the protective layer 218) may have a layer thickness of more than 1 μm, for example a layer thickness of several μm. In various embodiments, the adhesive may include or be a lamination adhesive.

In various embodiments, light-scattering particles, which can lead to a further improvement of the color angle distortion and of the output efficiency, may also be embedded in the layer of adhesive (also referred to as the adhesive layer). In various embodiments, dielectric scattering particles may be provided, for example, as light-scattering particles, for example metal oxides, for example silicon oxide (SiO2), zinc oxide (ZnO), zirconium oxide (ZrO2), indium tin oxide (ITO) or indium zinc oxide (IZO), gallium oxide (Ga2Oa), aluminum oxide or titanium oxide. Other particles may also be suitable, so long as they have a refractive index which is different to the effective refractive index of the matrix of the translucent layer structure, for example air bubbles, acrylate, or hollow glass spheres. Furthermore, for example, metal nanoparticles, metals such as gold or silver, iron nanoparticles, or the like, may be provided as light-scattering particles.

Furthermore, it should be pointed out that in various embodiments an adhesive may even be entirely obviated, for example in embodiments in which the cover, for example consisting of glass, is applied for example by means of plasma spraying, for example onto the protective layer 218.

In various embodiments, the cover and/or the protective layer 218 may have a refractive index (for example at a wavelength of 633 nm) of 1.55. The cover or cover layer and/or the protective layer 218 may have a refractive index which is less than the refractive index of the liquid and/or of the solid.

Furthermore, in various embodiments one or more antireflection layers (for example combined with the encapsulation 212, for example the thin-film encapsulation 212) may additionally be provided in the light-emitting component 200.

FIG. 3 shows a cross-sectional view of a light-emitting component 300 according to various embodiments.

The light-emitting component 300 according to FIG. 3 is very similar to the light-emitting component 200 according to FIG. 2, for which reason only the differences of the light-emitting component 300 according to FIG. 3 from the light-emitting component 200 according to FIG. 2 will be described below. In respect of elements which are the same, which are also denoted by the same references as in the case of the light-emitting component 200 according to FIG. 2, reference is made to the comments above regarding the light-emitting component 200 according to FIG. 2.

As represented in FIG. 3, in the case of the light-emitting component 300 the graphene layer 214 with the lens-like structure 216 is arranged outside the electrically active region 204, as can be seen, for example on or over the carrier 202, for example the substrate 202, which may be formed so as to be translucent or transparent.

The space between the graphene bubbles 216 and the carrier 202 may, as described above, be filled with air, or as an alternative with a liquid and/or a solid, which is formed so as to be as highly refractive as possible.

In various embodiments, the light-emitting component 300, for example the OLED 300, is configured as a bottom emitter, that is to say, as can be seen, that the first electrode 206 may be formed so as to be translucent or transparent, and that the second electrode 210 may be formed so as to be reflective.

As represented in FIG. 3, a planarization layer 302 is arranged on or over the at least one graphene layer 214, and the electrically active region 204 is arranged on or over the planarization layer 302 in such a way that the first electrode 206 is arranged on or over the planarization layer 302, and may for example be in physical contact with the planarization layer 302.

Optionally, even though not represented in FIG. 3, an encapsulation may be arranged between the electrically active region 204 and the carrier 202, for example an encapsulation as described above. For example, the encapsulation may be arranged between the electrically active region 204 and the graphene layer 214, or between the electrically active region 204 and the planarization layer 302.

In various embodiments, the planarization layer 302 may have a refractive index which is substantially equal to the refractive index of the organic functional layer structure. Thus, the material of the planarization layer 302 may have a refractive index in a range of from approximately $n=1.8$ to approximately $n=1.9$ (for example at a wavelength of 633 nm).

As can be seen, according to these embodiments, the graphene layer 214 including the graphene bubbles 216 is formed on the translucent or transparent carrier 202, and a planarization (as highly refractive as possible) may subsequently be applied (for example in the form of the planarization layer 302), on which the first (translucent or transparent) electrode 206 may subsequently be applied. The organics 208 of the OLED 300, i.e. the organic functional layer structure 208, are then applied, for example deposited, thereon.

FIG. 4 shows a cross-sectional view of a light-emitting component 400 according to various embodiments.

The light-emitting component 400 according to FIG. 4 is very similar to the light-emitting component 200 according to FIG. 2, for which reason only the differences of the light-emitting component 400 according to FIG. 4 from the light-emitting component 200 according to FIG. 2 will be described below. In respect of elements which are the same, which are also denoted by the same references as in the case of the light-emitting component 200 according to FIG. 2, reference is made to the comments above regarding the light-emitting component 200 according to FIG. 2.

As represented in FIG. 4, in the case of the light-emitting component 400 the graphene layer 214 with the lens-like structure 216 is part of the first electrode 206 (as an alternative or in addition part of the second electrode 210). In various embodiments, the graphene layer 214 may therefore be arranged on or over the carrier 202, and may for example be in physical contact therewith.

In these embodiments, the second electrode 210 may be configured so as to be translucent (for example transparent) or reflective.

As can be seen, according to these embodiments, the graphene layer 214 including the graphene bubbles 216 is formed on the translucent or transparent carrier 202. The graphene bubbles 216 may now on the one hand be covered with a high-index layer (which for example has a refractive index in a range of approximately $n=1.8$ to 1.9) (for example one or more thin layers of $SiN$, $TiO_2$, $ZrO_2$, $Al_2O_3$) or be directly in physical contact with a wet-chemically deposited electrode (for example the first electrode 206) (for example based on silver nanowires). Depending on the quality of a likewise provided planarization, there is now either an OLED completely structured through or an OLED on which the interface with the graphene bubbles 216 has a refractive index discontinuity, so that an output-increasing lens effect can be achieved.

In various embodiments, the efficiency of organic light-emitting diodes, in general of optoelectronic components, for example of light-emitting components, is increased.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:
1. An optoelectronic component, comprising:
   an electrically active region, comprising:
      a first electrode;
      a second electrode;
      an organic functional layer structure between the first electrode and the second electrode;

a light-refracting structure which comprises at least one graphene layer, in which at least one lens-like structure is formed.

2. The optoelectronic component as claimed in claim 1, wherein the graphene layer forms a part of the first electrode and/or of the second electrode.

3. The optoelectronic component as claimed in claim 2, further comprising:
a carrier;
wherein the graphene layer is arranged as part of the first electrode on or over the carrier.

4. The optoelectronic component as claimed in claim 2, wherein the second electrode is configured so as to be translucent or reflective.

5. The optoelectronic component as claimed in claim 1, wherein the graphene layer is arranged outside the electrically active region.

6. The optoelectronic component as claimed in claim 3, further comprising:
a carrier;
wherein the graphene layer is arranged on or over the carrier;
a planarization layer on the graphene layer;
wherein the electrically active region is arranged on or over the planarization layer.

7. The optoelectronic component as claimed in claim 6, further comprising:
an encapsulation being arranged between the electrically active region and the carrier.

8. The optoelectronic component as claimed in claim 7, wherein the encapsulation is arranged between the electrically active region and the graphene layer or between the electrically active region and the planarization layer, wherein the planarization layer has a refractive index which is substantially equal to the refractive index of the carrier.

9. The optoelectronic component as claimed in claim 6, wherein the first electrode is arranged on or over the planarization layer;
wherein the first electrode is configured so as to be translucent; and
wherein the second electrode is configured so as to be translucent or reflective.

10. The optoelectronic component as claimed in claim 3, wherein the first electrode is configured so as to be reflective; and
wherein the second electrode is configured so as to be translucent;
wherein the graphene layer is arranged on or over the second electrode.

11. The optoelectronic component as claimed in claim 10, further comprising:
a carrier;
wherein the first electrode is arranged on or over the carrier.

12. The optoelectronic component as claimed in claim 10, further comprising:
an encapsulation on or over the second electrode.

13. The optoelectronic component as claimed in claim 12, wherein the graphene layer is arranged on or over the encapsulation.

14. The optoelectronic component as claimed in claim 1, wherein the at least one lens-like structure is at least partially filled with a liquid and/or a solid, wherein the liquid and/or the solid preferably has a refractive index which is substantially equal to the refractive index of the organic functional layer structure.

15. The optoelectronic component as claimed in claim 10, further comprising:
a cover layer on or over the graphene layer, wherein the cover layer has a refractive index which is less than the refractive index of the liquid and/or of the solid.

16. The optoelectronic component as claimed in claim 3, wherein the second electrode is configured so as to be translucent or reflective.

17. The optoelectronic component as claimed in claim 8, wherein the planarization layer has a refractive index which is substantially equal to the refractive index of the organic functional layer structure.

18. The optoelectronic component as claimed in claim 11, further comprising:
an encapsulation on or over the second electrode.

* * * * *